United States Patent [19]

Palara

[11] Patent Number: 5,554,878
[45] Date of Patent: Sep. 10, 1996

[54] INTERGRATED HIGH-VOLTAGE RESISTOR INCLUDING FIELD-PLATE LAYERS

[75] Inventor: Sergio Palara, Acitrezza, Italy

[73] Assignee: CO. RI. M. ME., Catania, Italy

[21] Appl. No.: 352,425

[22] Filed: Dec. 8, 1994

Related U.S. Application Data

[63] Continuation of Ser. No. 67,664, May 26, 1993, abandoned.

[30] Foreign Application Priority Data

May 28, 1992 [EP] European Pat. Off. .............. 92830270

[51] Int. Cl.$^6$ .......................... H01L 23/60; H01L 23/64
[52] U.S. Cl. .......................... 257/488; 257/489; 257/536; 257/620; 257/630
[58] Field of Search .................... 257/536, 488, 257/489, 620, 630

[56] References Cited

U.S. PATENT DOCUMENTS 4,212,025  7/1980  Hirasawa et al. .................. 257/536
4,423,433  12/1983  Imaizumi et al. .................. 257/536
4,423,434  12/1983  Komatsu ........................... 257/620

FOREIGN PATENT DOCUMENTS

| 0077072 | 4/1983 | European Pat. Off. . | |
|---|---|---|---|
| 0240435 | 10/1987 | European Pat. Off. . | |
| 3103785 | 12/1981 | Germany . | |
| 0031167 | 2/1982 | Japan | 257/536 |
| 0079657 | 5/1982 | Japan | 257/536 |
| 0012343 | 1/1983 | Japan | 257/536 |
| 0144960 | 6/1990 | Japan | 257/536 |

*Primary Examiner*—Peter Toby Brown
*Attorney, Agent, or Firm*—David V. Carlson; Clarence T. Tegreene; Seed and Berry LLP

[57] ABSTRACT

A high-voltage resistor integrated on a semiconductor substrate with opposite sign conductivity, and being of a type with one end connected to the substrate and another end connected to a lower electric potential than the substrate, further comprises at least one thin layer of the field plate type covering at least a section of the resistor.

23 Claims, 2 Drawing Sheets

5,554,878

INTERGRATED HIGH-VOLTAGE RESISTOR INCLUDING FIELD-PLATE LAYERS

CROSS-REFERENCE TO RELATED APPLICATION

This application is a continuation of U.S. patent application Ser. No. 08/067,664, filed May 26, 1993, now abandoned.

TECHNICAL FIELD

This invention relates to a high-voltage resistor integrated on a semiconductor substrate, having an opposite conductivity type, and being of a type with one end connected to the substrate and another end connected to a lower electric potential than the substrate.

BACKGROUND OF THE INVENTION

In the specific field of application of this invention, it is known to provide high-voltage resistors having a horizontal geometry which is basically of the spiral pattern type and is formed on a semiconductor substrate having a predetermined polarity, opposite in sign from that of the resistor.

One end of the spiral is connected to the substrate, and the other end is connected to ground or in any case to a lower electric potential than the substrate.

One such construction is known, for instance, from U.S. Pat. No. 4,792,840 and allows the resistor to so distribute the equipotential lines across the substrate surface as to hold the difference of potential at the junction points between the resistor and the substrate surface below the junction breakdown voltage. The potential difference varies linearly toward the spiral center, which allows the resistor to withstand high voltages of up to 400 Volts.

While being beneficial from this point of view, said prior approach still has a serious drawback.

When any two regions of the resistor are taken which lie close to each other, i.e., regions of two adjacent turns, one of them is bound to be at a lower potential than the other. As a result, the positive charges present in the oxide layer that covers the spiral will be pulled toward the metallic contact associated with the lower potential region.

The build-up of positive charges gradually forms a conductive layer proper, referred to in the art as a phantom layer, which extends toward the higher potential region.

This phantom layer, being additionally connected to a negative potential present at the metallic contact, establishes conduction between the aforesaid two underlying regions at different potentials.

Briefly stated, the phantom layer functions as if it were the gate of a MOS transistor, with the two regions at different potentials corresponding to the source and drain of the transistor.

This causes a deep alteration of the spiral resistor characteristics, and deterioration of its reliability.

SUMMARY OF THE INVENTION

According to principles of the present invention, a high-voltage resistor is provided of the type which has constructional and performance characteristics that overcome the serious drawbacks besetting the prior art.

Accordingly, it is an object of this invention to provide a resistor exhibiting superior reliability.

Another object of the invention is to arrange for the resistor to always have one end connected to the substrate and the other end to ground, or more generally stated, to have the other end connected to a lower electric potential than the substrate.

According to principles of the present invention, the resistor is partially covered with a field-plate layer.

Consistent with the inventive solutions, the technical problem is solved by a resistor as indicated and defined in the claims, the invention being determined by the scope of the claims.

The features and advantages of a resistor according to this invention will become apparent from the following detailed description of an embodiment thereof, given by way of example and not of limitation with reference to the accompanying drawings.

DETAILED DESCRIPTION OF THE INVENTION

Figure 1:
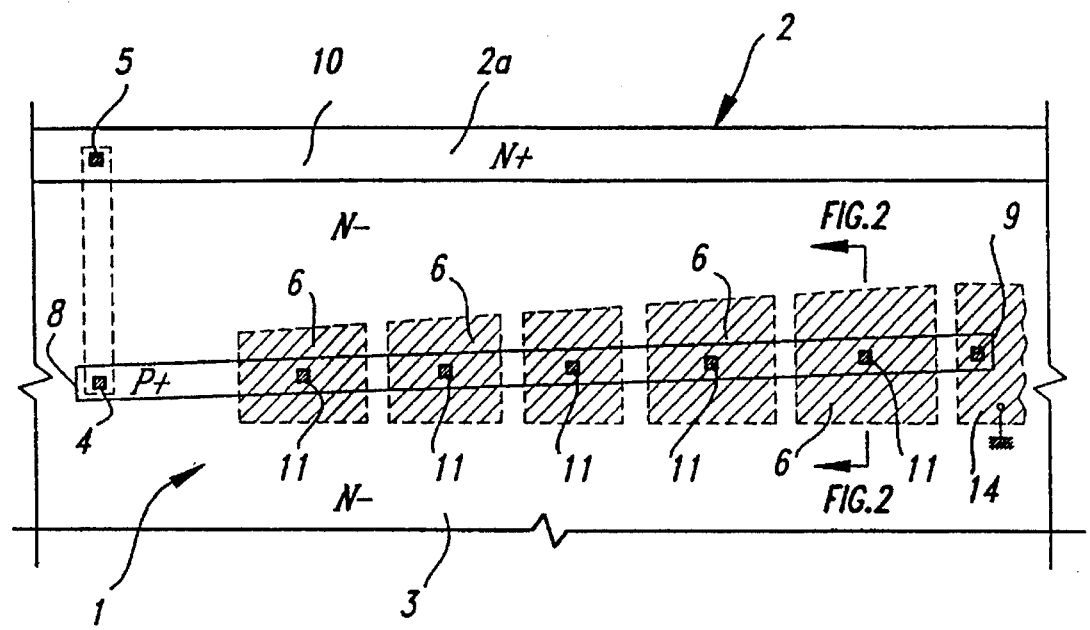
FIG. 1 is a top plan view showing schematically a resistor according to the invention as integrated on a semiconductor substrate.

With reference to the drawing views, generally and schematically shown at 1 is a resistor formed, in accordance with the invention, on a semiconductor silicon substrate 2 of an integrated circuit or chip.

The substrate 2 comprises a first base region 2A having predetermined conductivity, e.g., of the N+ type, and being covered with an epitaxial layer 3 of the N+ type. The latter 3 is conventionally covered with an oxide layer 16.

The resistor 1 is obtained by a doping opposite that of the epitaxial layer 3, e.g., of the P+ type.

The resistor 1 is formed into an essentially elongate linear pattern, or stated otherwise, is a region characterized by a reduced width with respect to its length to provide a desired resistance value. This region can be formed using conventional diffusion or implantation techniques so as to rise substantially to the surface of the epitaxial layer 3.

The epitaxial layer 3 ensures electrical insulation all around the resistor 1.

The substrate 2 has an edge region 10 to which one end 8 of the resistor 1 is connected. This connection is accomplished through a pair of metallization contacts 4 and 5. The other end 9 of the resistor 1 is connected to ground or, more generally, to a lower electric potential than the substrate 2.

Alternatively, in a different embodiment, the end 8 of the resistor is connected to a first, high voltage potential that is not the substrate voltage and the end 9 is connected to a second, lower voltage potential than that to which the end 8 is connected.

The electric potential on the resistor 1 decreases linearly, from the end 8 connected to the substrate 2, to the grounded end 9.

Concurrently therewith, the potential difference at the junction 7 between the P+ region of the resistor 1 and the N– epitaxial layer 3 increases. The potential difference between the P+ region of resistor 1 and the N– epitaxial layer 3 is greater near the end 9, than near the end 8. This potential difference could reach the breakdown value for the junction 7.

However, the invention advantageously provides for thin metallization layers 6 of the field plate type to be deposited over the resistor 1 which extend through some sections of the resistor 1.

Such field-plate layers 6 extend over the P+ region 1 and somewhat over the epitaxial layer 3 beyond the resistor sides. Specifically, the field plate layers 6 also cover the N-P junction 7 on both sides of the resistor 1 and the width of the field plate layers is slightly increased from the edge end 8 to the other end 9. That is, the distances by which the metallization of the field plate layers 6 extend beyond the resistive channel is larger adjacent the end 9 than the end 8. The overlap at the edge nearest the end 9 of each individual field plate layer 6 is thus correspondingly larger than the overlap at its edge nearest the end 8.

Figure 2:
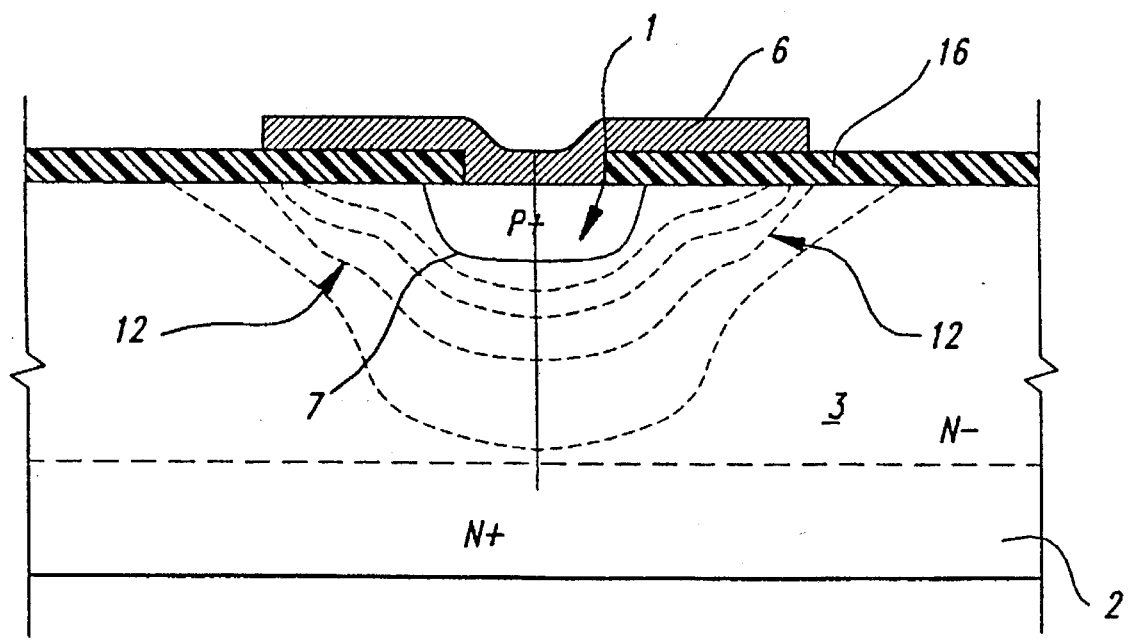
FIG. 2 is a schematic cross-sectional view taken through the resistor in FIG. 1 along line II—II.

Shown in FIG. 2 is the effect produced on the resistor 1 by the thin field plate layers 6.

The field plate 6, being connected to the P+ region 1 subjected to a lower voltage than that of the N− epitaxial layer 3 containing it, will alter the pattern of equipotential lines 12 in the proximities of the junction 7. This raises considerably the value of the breakdown voltage of the junction 7.

On the resistor 1, there are opened vias 11 whereby the various field plates 6 are connected. These vias 11 are arranged centrally of each field plate 6, although the connection could alternatively be established at some off-centered location. Any off-centered connection would not affect the pattern of equipotential lines 12 materially.

A modified embodiment of the inventive resistor 1 will now be described with specific reference to the example shown in FIG. 3.

In this variant, cooperating parts and details which are constructed and operated in a like manner to the previous embodiment are denoted by the same reference numerals.

Figure 3:
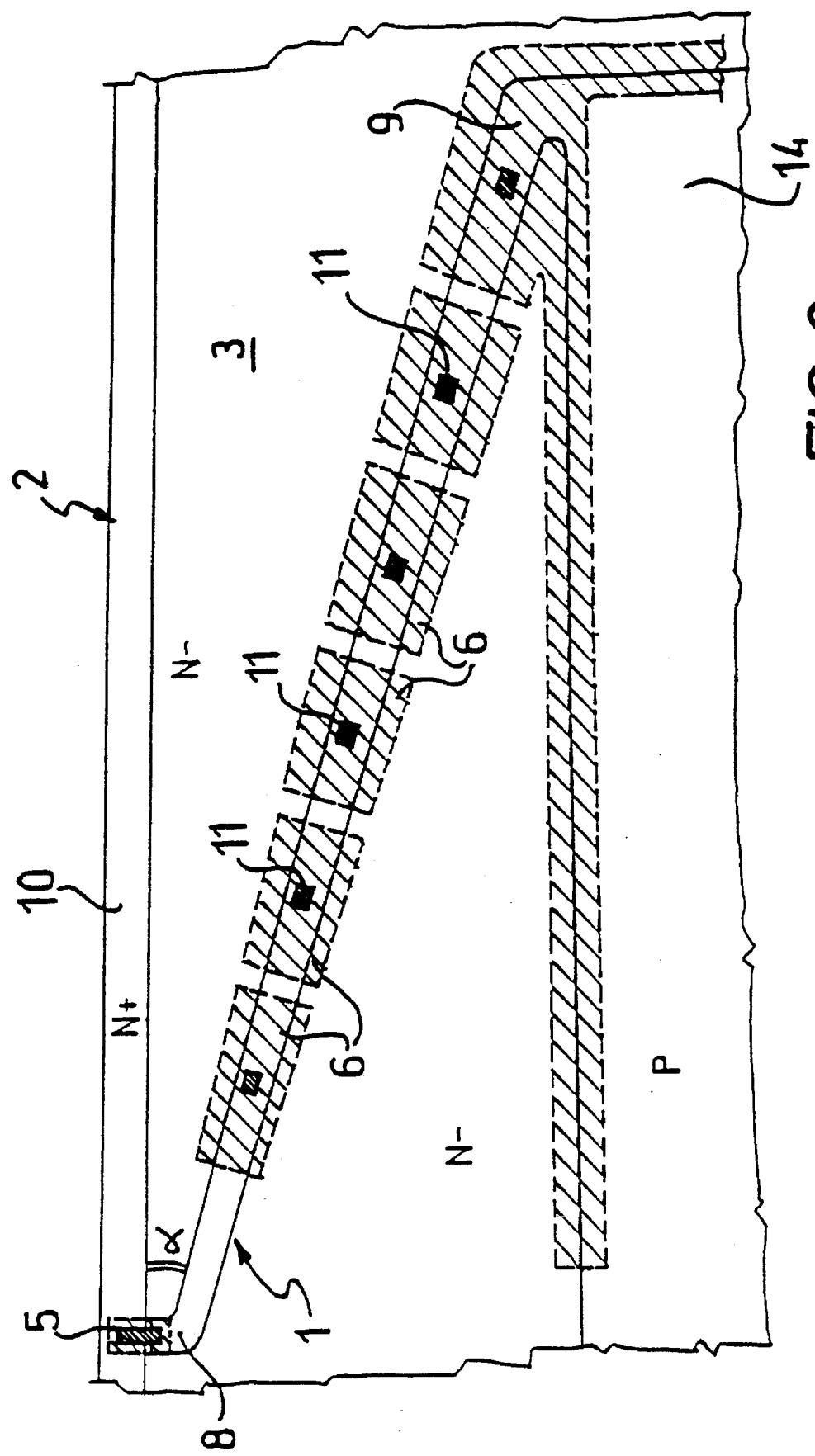
FIG. 3 is a top plan view showing schematically a modified embodiment of the inventive resistor.

As shown in FIG. 3, the end 8 of the resistor 1 is connected, in this variant, to the substrate 2 directly at the edge region 10 by via 5 which provides a metallic contact.

The other end 9 of the resistor 1 is connected to an insulative region 14 formed centrally of the integrated circuit.

This insulative region 14 is also connected to ground in a conventional way.

The resistor 1 is set substantially at an inclination angle α to the edge 10 which is a direct function of the voltage gradient through the resistor 1.

The resistor inclination to the edge 10 takes into account the fact that the potential difference of the resistor 1 relative to the edge 10 increases linearly toward the end 9. As a result, the distance between the N+ edge 10 and the P+ region of the resistor 1 increases concurrently with increasing potential across the distance from the P+ region of resistor 1 to the edge 10.

Concurrently therewith, however, the distance between the resistor 1 and the insulative region 14 decreases as the related potential difference decreases.

The resistor 1 of this invention solves, therefore, the technical problem, and affords a number of advantages, of which most important is the increased breakdown voltage across the junction 7 between the resistor 1 and the epitaxial layer 3 on which it is formed. This reflects in improved reliability of the device.

I claim:

1. A high-voltage resistor structure comprising:
   a substantially linear high-voltage resistor of a first conductivity type integrated in an epitaxial layer on a semiconductor substrate having a second conductivity type, the semiconductor substrate including a contact member of the second conductivity type at a first electric potential, the resistor having a first end electrically connected to the substrate by the contact member through a conductive contact extending between the first end and the contact member such that the first end and the substrate are maintained at the first electric potential and a second end electrically connected to a lower electric potential than the first end; and
   a plurality of field-plate layers, each field-plate layer covering at least a section of the resistor, in aligned fashion, the field-plate layers discontinuously covering the resistor providing gaps between the field-plate layers.

2. A resistor structure according to claim 1, characterized in that each field-plate layer has a length inversely proportional to the electric potential gradient across the resistor.

3. A resistor structure according to claim 1,
   characterized in that each field-plate layer has linearly increasing width toward the second end.

4. A resistor structure according to claim 3, characterized in that each field-plate layer is connected electrically to the corresponding section of the resistor through a metallic contact.

5. A resistor structure according to claim 4, characterized in that said field-plate layer also covers an interface between a side of the resistor and the epitaxial layer.

6. A resistor structure according to claim 1, characterized in that the width of said field-plate layers increases proportionally to the potential difference between the section of resistor and the epitaxial layer containing the section of resistor.

7. A resistor structure according to claim 1, characterized in that the first end is connected to an edge of the substrate and the second end is connected to an insulative region located centrally of the semiconductor such that the resistor extends from said edge at an inclination angle having a predetermined value.

8. A resistor structure according to claim 7, characterized in that said inclination angle is proportional to the voltage gradient through the resistor.

9. A high-voltage resistor integrated into a semiconductor substrate of a first conductivity type, comprising:
   a first region of the first conductivity type connected electrically to a first voltage potential and integrally carried by the substrate, the first region having an edge extending in a first direction;
   an elongated region of the opposite conductivity type of the substrate forming a resistor and having a first end and a second end, said first end being connected electrically to the first region and the second end being connected to a second voltage potential, lower than the first end, the elongated region diverging at an acute angle from the edge of the first region; and
   a multiplicity of field-plate layers each covering a corresponding discrete section of the elongated region, each of said field-plate layers being connected electrically to its corresponding discrete section of the elongated region.

10. The device of claim 9 wherein the field-plate layers discontinuously cover the elongated region, each field plate layer having a first plate end located at a first distance from the first end and a second plate end located at a second distance from the second end.

11. The device of claim 10 wherein the field-plate layers have a width which increases linearly from the first plate end to the second plate end region.

12. The device of claim 10 wherein at each point along each field plate layer there is a width, said width being proportional to its distance from the first end of the elongate region.

13. The device of claim 12 wherein the field-plate layers have lengths inversely proportional to an electrical potential across a junction between the elongated region and the semiconductor substrate.

14. The device of claim 10 wherein each field-plate layer covers a junction between the elongated region and the semiconductor substrate.

15. A high-voltage integrated resistor structure comprising:

a substrate of a first conductivity type carrying an epitaxial region;

a linear resistor of a second conductivity type embedded in the epitaxial region and diverging at an acute angle from an edge region of the substrate at a first electric potential, the linear resistor having a first end and a second end, the second end being connected to a second electrical potential different from the first electric potential; and a plurality of field plates overlaying respective sections of the resistor wherein the field plates have widths varying proportionally to an electric potential between the resistor and the edge region;

wherein each of the field plates is electrically connected to its corresponding section of the resistor by a metallic contact and wherein the metallic contacts are centrally located on their respective field plates.

16. A high-voltage resistor structure comprising:

a substantially linear high-voltage resistor of a first conductivity type integrated in an epitaxial layer of a semiconductor substrate having a second conductivity type, the semiconductor substrate including an edge region of the second conductivity type at a first electric potential, the resistor having a first end directly electrically connected to the substrate at the edge region of the substrate such that the first end, the edge region and the substrate are maintained at the first electric potential and a second end electrically connected to a lower electric potential than the edge region of the substrate; and a plurality of field-plate layers, each field-plate layer covering at least a section of the resistor, in aligned fashion, the field-plate layers discontinuously covering the resistor, the field-plate players being spaced apart along the resistor such that gaps are formed between successive field-plate layers.

17. A resistor structure according to claim 16 wherein each field-plate layer has a length inversely proportional to the electric potential difference between the electric potential of the corresponding section of the resistor covered by the field-plate layer and the first electric potential.

18. A resistor structure according to claim 16 wherein each field-plate layer has linearly increasing width toward the second end.

19. A resistor structure according to claim 16 wherein the width of each said field-plate layer is proportional to the potential difference between the corresponding section of resistor and the epitaxial layer.

20. A resistor structure according to claim 16 wherein each field-plate layer is directly electrically connected to the corresponding section of the resistor.

21. A resistor structure according to claim 20 wherein said field-plate layer also overlays an interface between a side of the resistor and the epitaxial layer on the semiconductor substrate.

22. A resistor structure according to claim 16 wherein the linear resistor has a center line extending from the first end to the second end, said center line being oriented at an acute inclination angle from the edge region, as the center line is traversed from the first end to the second end, the distance between the center line and the edge region increases.

23. A resistor structure according to claim 22 wherein the inclination angle is proportional to the voltage gradient through the resistor.

* * * * *